United States Patent
Sandhu et al.

(10) Patent No.: US 6,495,468 B2
(45) Date of Patent: *Dec. 17, 2002

(54) LASER ABLATIVE REMOVAL OF PHOTORESIST

(75) Inventors: Gurtej S. Sandhu, Boise, ID (US); Shubneesh Batra, Boise, ID (US)

(73) Assignee: Micron Technology, Inc., Boise, ID (US)

(*) Notice: Subject to any disclaimer, the term of this patent is extended or adjusted under 35 U.S.C. 154(b) by 116 days.

This patent is subject to a terminal disclaimer.

(21) Appl. No.: 09/749,041

(22) Filed: Dec. 26, 2000

(65) Prior Publication Data

US 2001/0002337 A1 May 31, 2001

Related U.S. Application Data

(63) Continuation of application No. 09/219,181, filed on Dec. 22, 1998, now Pat. No. 6,211,093.

(51) Int. Cl.⁷ .............................................. H01L 21/312
(52) U.S. Cl. ................. 438/725; 438/623; 438/624; 438/637; 430/329; 264/400; 219/121.85
(58) Field of Search ................................ 438/623, 624, 438/637, 700, 702, 725, 976; 430/317, 329; 219/121.85; 264/400

(56) References Cited

U.S. PATENT DOCUMENTS

| 3,873,361 A | 3/1975 | Franco et al. ............... 117/212 |
| 4,617,085 A | 10/1986 | Cole, Jr. et al. ............ 156/643 |
| 4,803,177 A | 9/1989 | Rabinzohn ................... 437/51 |
| 4,886,573 A | 12/1989 | Watanabe et al. ............ 156/643 |
| 4,961,259 A | 10/1990 | Schreiber ..................... 29/852 |
| 5,103,288 A | 4/1992 | Sakamoto et al. ............ 357/71 |
| 5,114,834 A | 5/1992 | Nachshon .................... 430/329 |
| 5,143,820 A | 9/1992 | Kotecha et al. ............. 430/314 |
| 5,354,711 A | 10/1994 | Heitzmann et al. .......... 437/182 |
| 5,393,712 A | 2/1995 | Rostoker et al. ............. 437/238 |
| 5,487,852 A | 1/1996 | Ludden et al. ............... 264/400 |
| 5,565,384 A | 10/1996 | Havemann ................... 437/228 |

(List continued on next page.)

FOREIGN PATENT DOCUMENTS

| EP | 813114 A2 | 12/1991 |
| JP | 2-254720 A | 10/1990 |
| JP | 3-290920 A | 12/1991 |
| JP | 4-171726 A | 6/1992 |
| JP | 5-29211 A | 1/1993 |

OTHER PUBLICATIONS

Research Disclosure 408077, "Forming Copper Dry Etch Hard Mask—Using Silicon Nitride and Silica Deposition on Copper, Before Lithography and Differential Etch Stopping at the Silicon Nitride Layer", Apr. 1998, 1 page.

Research Disclosure #26879, "Laser Resist Stripping and Cleaning" 268, Aug. 1986.

Research Disclosure #32651 "A Thin Film High Damage Threshold Metal Laser Mask" 326, Jun. 1991.

Hunger, E., et al. "Multishot ablation of polymer and metal films at 248 nm" Appl. Surf. Sci. 54, 227–231, 1992.

Wolf, Stanley, "Silicon Processing for the VLSI Era" vol. 2, 214–217, 1990.

*Primary Examiner*—Anita Alanko
(74) *Attorney, Agent, or Firm*—Wells St. John P.S.

(57) ABSTRACT

In one aspect, the invention provides a method of exposing a material from which photoresist cannot be substantially selectively removed utilizing photoresist. In still another aspect of the invention, laser ablation of photoresist is utilized. In one implementation, the invention comprises forming a first material over a substrate. Photoresist is deposited over the first material and an opening is formed within the photoresist over the first material. Etching is then conducted into the first material through the photoresist opening. After the etching, the photoresist is laser ablated from over the first material.

19 Claims, 12 Drawing Sheets

U.S. PATENT DOCUMENTS

| | | | |
|---|---|---|---|
| 5,576,517 A | 11/1996 | Wojnarowski et al. | 174/262 |
| 5,595,627 A | 1/1997 | Inazawa et al. | 156/643.1 |
| 5,616,524 A | 4/1997 | Wei et al. | 438/4 |
| 5,686,354 A | 11/1997 | Avanzino et al. | 437/190 |
| 5,741,626 A | 4/1998 | Jain et al. | 430/314 |
| 5,789,319 A | 8/1998 | Havemann et al. | 438/668 |
| 5,821,169 A | 10/1998 | Nguyen et al. | 438/736 |
| 5,843,363 A | 12/1998 | Mitwalsky et al. | 264/400 |
| 5,935,868 A | 8/1999 | Fang et al. | 438/692 |
| 5,008,135 A | 12/1999 | Oh et al. | 438/720 |
| 5,998,305 A | 12/1999 | Holmer et al. | 438/795 |
| 6,048,787 A | 4/2000 | Lee | 438/625 |
| 6,107,183 A | 8/2000 | Sandhu et al. | 438/622 |

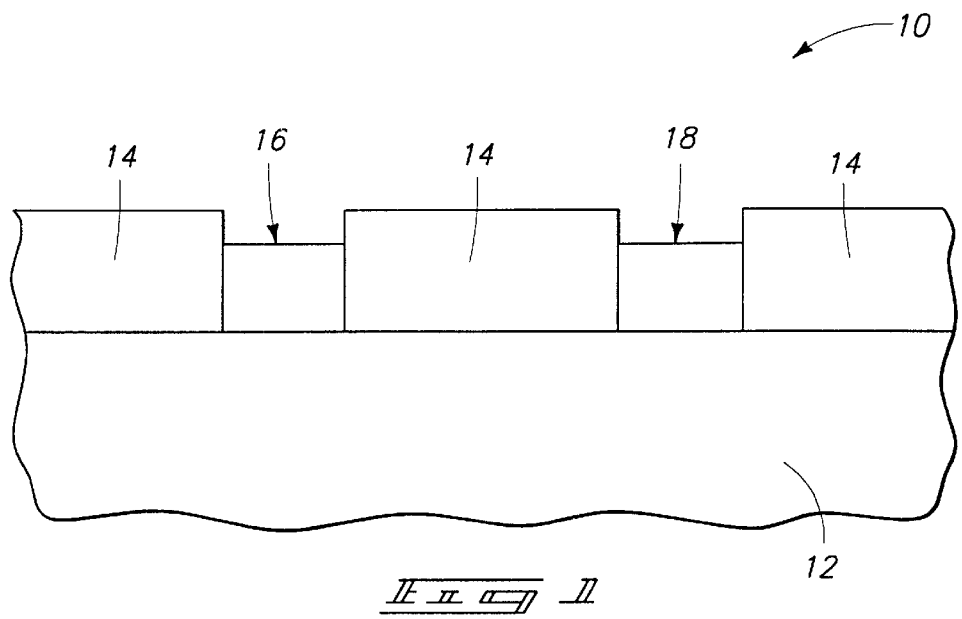
_Fig 1_
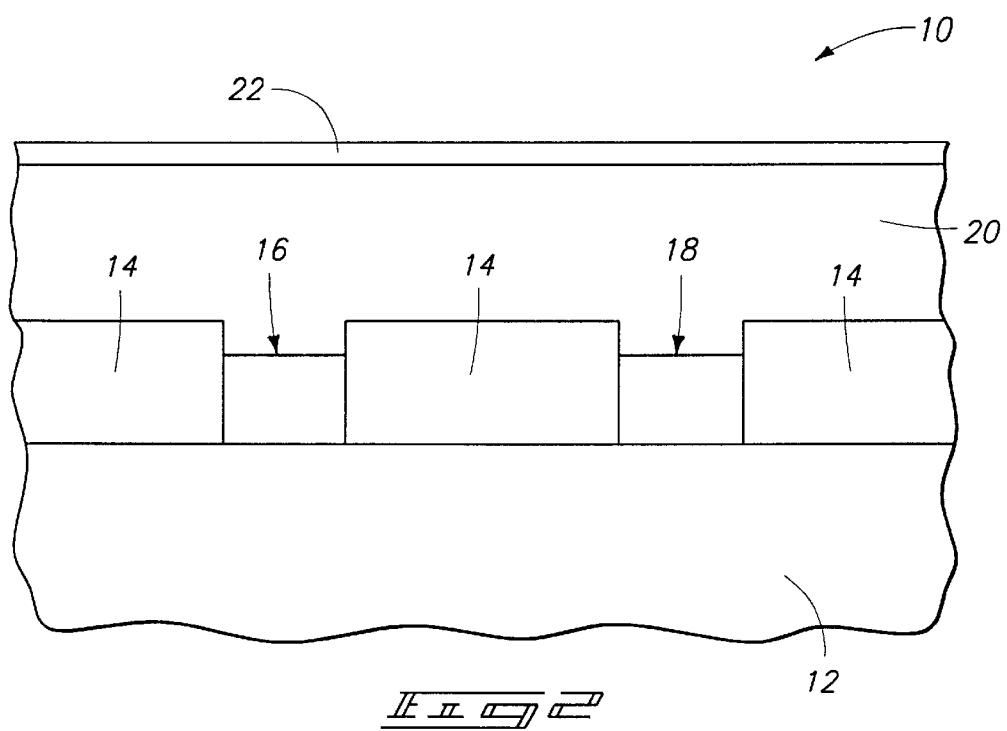
_Fig 2_

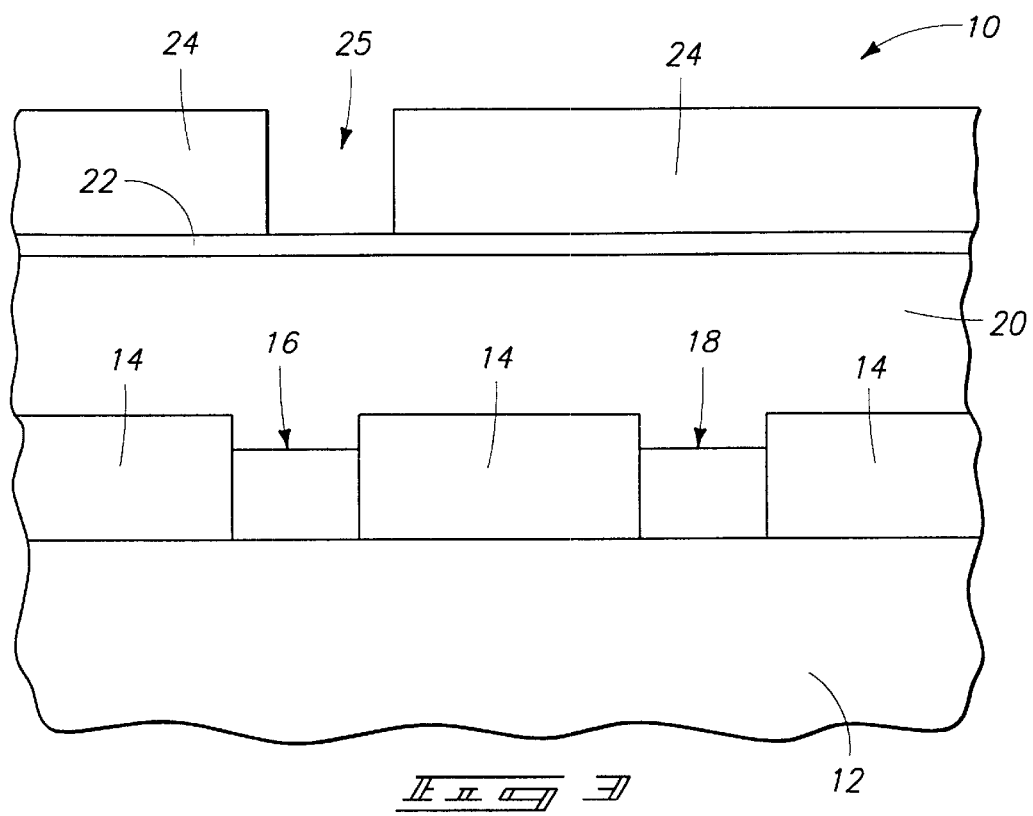
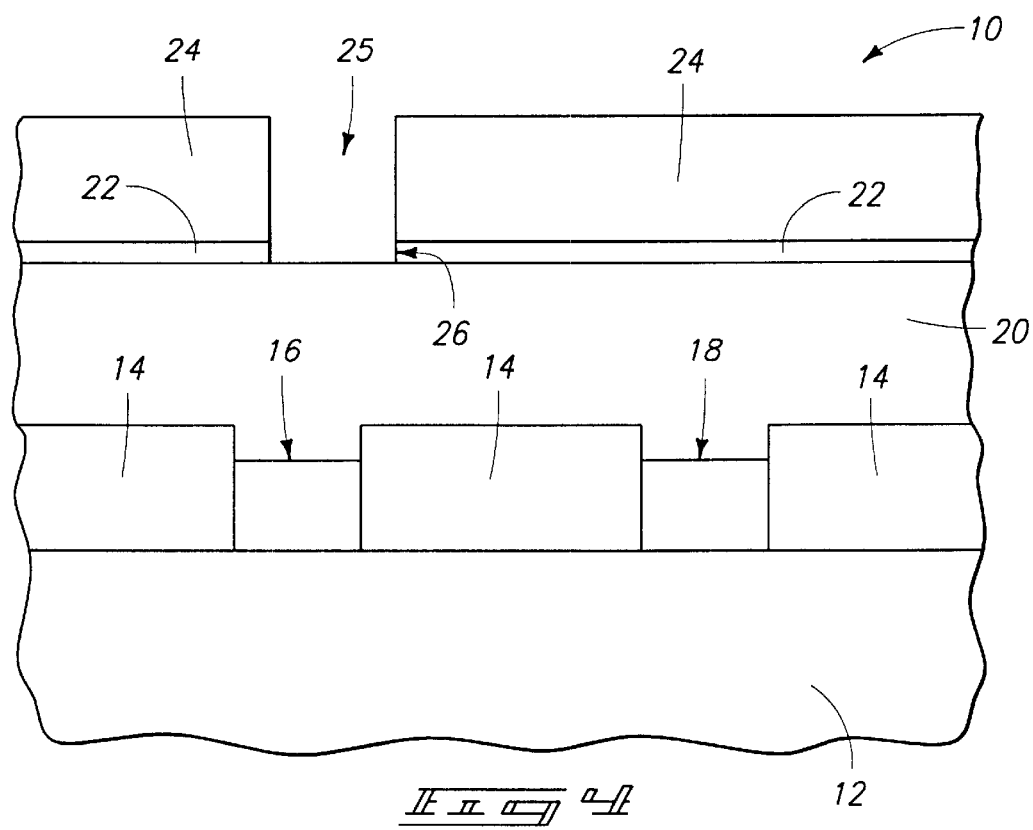

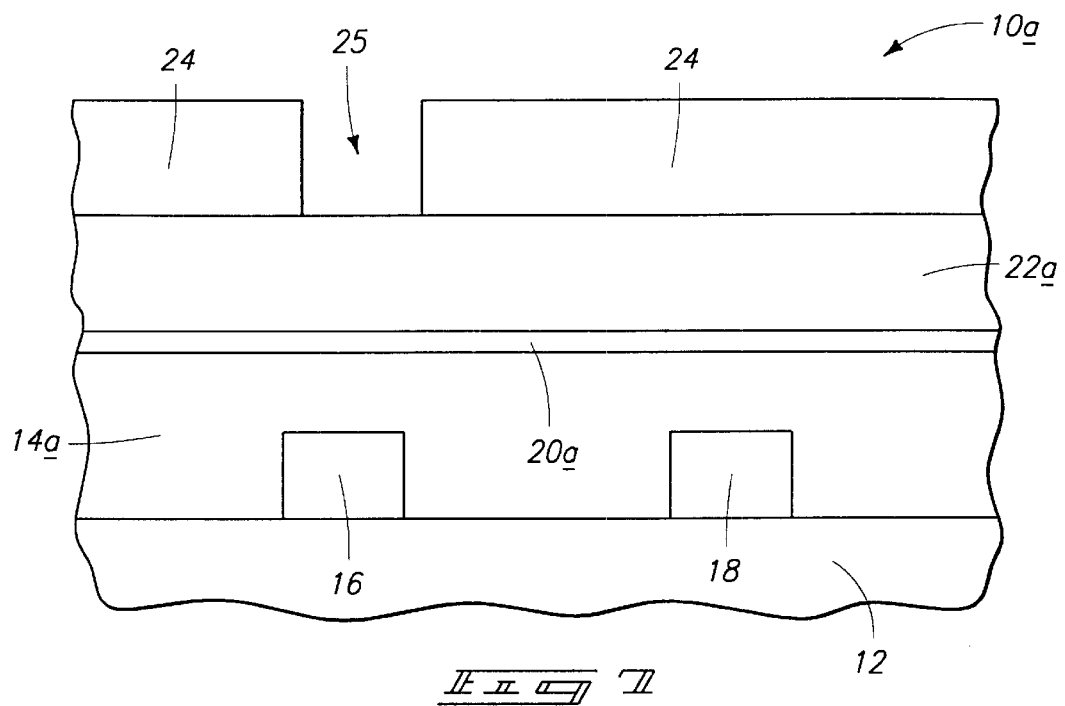
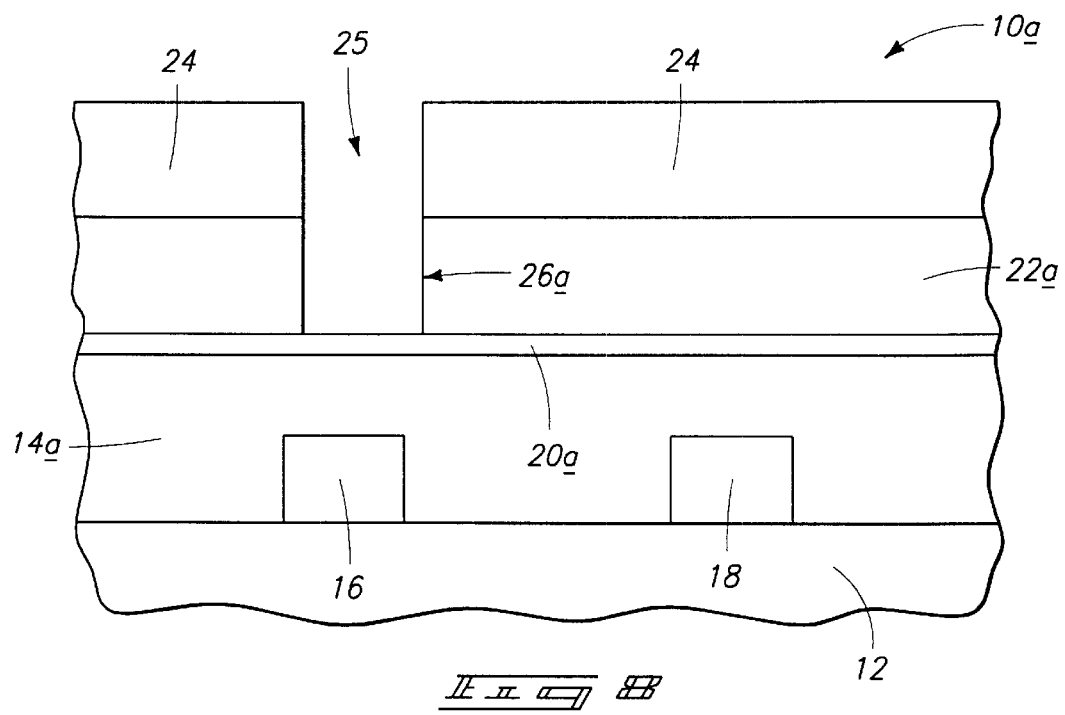

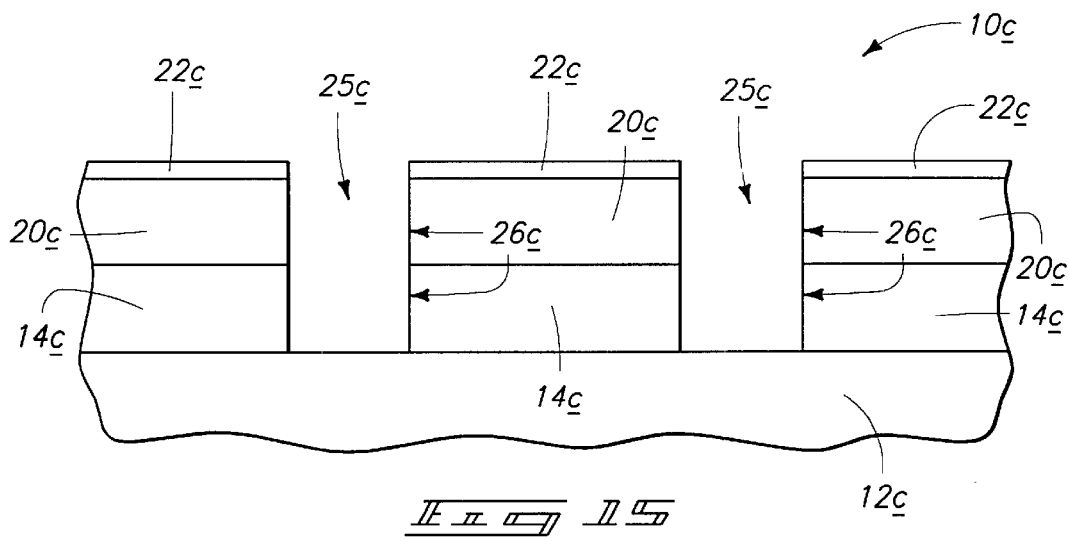
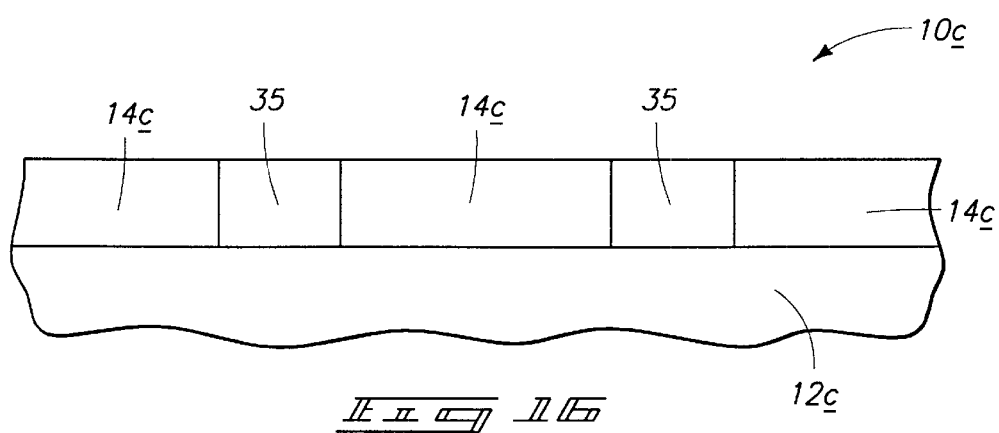

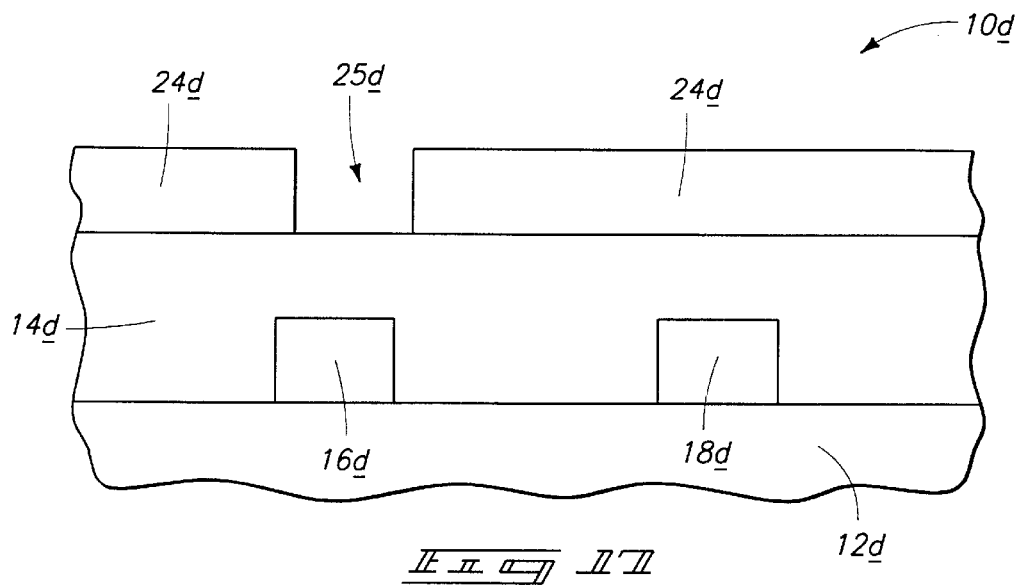
_Fig. 17_
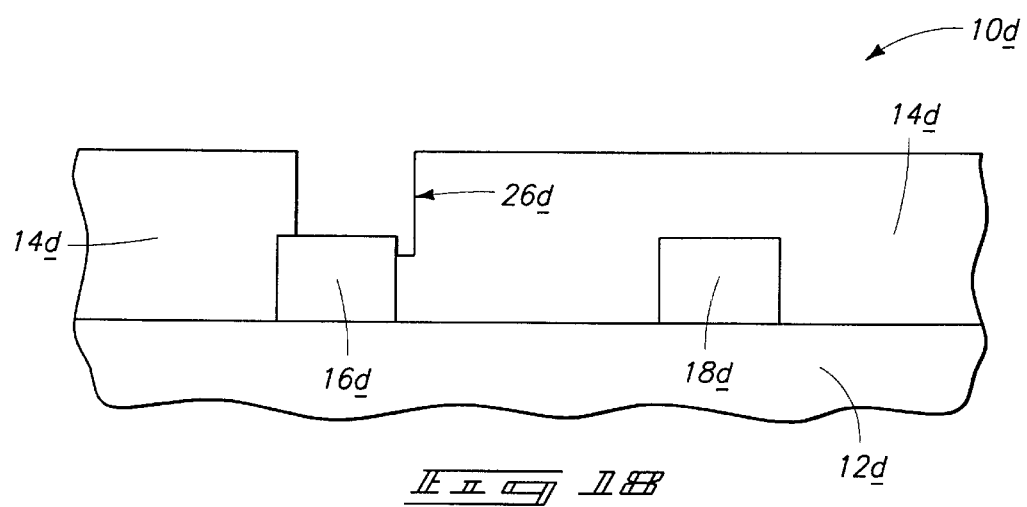
_Fig. 18_

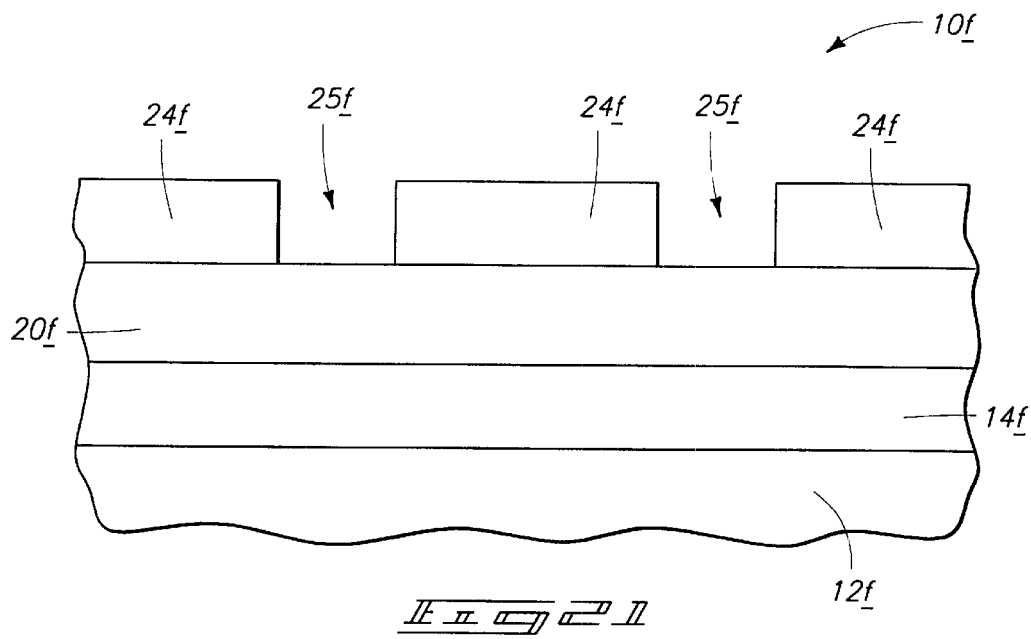
F I G 21
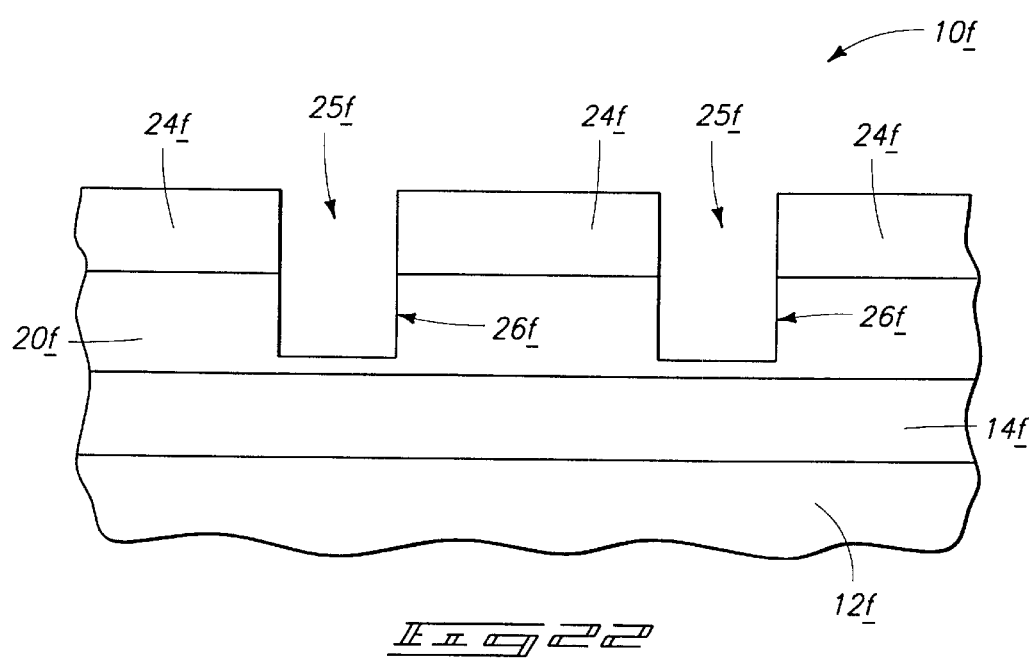
F I G 22

LASER ABLATIVE REMOVAL OF PHOTORESIST

CROSS REFERENCE TO RELATED APPLICATION

This is a Continuation of U.S. patent application Ser. No. 09/219,181, filed Dec. 22, 1998, now U.S. Pat. No. 6,211,093 B1 and titled "Laser Ablative Removal of Photoresist".

TECHNICAL FIELD

This invention relates generally to semiconductor processing methods, including methods of forming contact openings to devices, exposing material from which photoresist cannot be substantially selectively removed, forming a series of conductive lines, and removing photoresist from substrates.

BACKGROUND OF THE INVENTION

There is a continuing goal in semiconductor processing to fabricate smaller and denser circuits. Correspondingly, the individual circuit components continue to be placed closer and closer together. Individual circuit elements or groups of elements are typically connected together by conductive lines running over the substrate. Conductive lines within a given layer, as well as conductive lines in different layers, are typically electrically isolated from one another by dielectric materials commonly referred to as dielectrics.

Insulating dielectric materials exhibit a property known as a dielectric constant. Such is effectively a measurement of capacitance between two spaced conductors. The ratio of the capacitance between two conductors within a given material between them to the capacitance of the same two conductors with nothing (a vacuum) between them is known as the dielectric constant of the given material. Thus, a material with a high dielectric constant placed between two conductors increases the capacitance between the conductors. Where such materials would be highly desirable as capacitor dielectrics in capacitor constructions, such materials are highly undesirable as insulating material between conductors. Unneeded capacitance between conductive lines slows and otherwise adversely affects circuit performance.

Silicon dioxide has typically been a preferred interlevel dielectric layer material of choice. Although such material has a high dielectric constant, the prior art spacing between conductive components has been sufficiently great from one another to result in acceptable circuit designs. Yet as circuit density increases, and thus the spacing between adjacent devices decreases, there is a continuing goal to find and develop improved low dielectric constant materials for use as interlevel dielectrics. Such materials can, however, have their own associated drawbacks with respect to fabrication.

For example, one general class of low dielectric constant materials desirable for interlevel dielectrics are organic insulating materials such as parylene and polytetrafluoroethylene. Materials such as these have been shown to have very low dielectric constants of 2.0 or less, and are stable under high moisture and high temperature conditions. However, it is difficult to pattern vias into these materials utilizing photoresist as the photoresist cannot be readily stripped off selectively from these materials. The organic nature of photoresist and the organic insulating dielectric layer materials would make selective stripping of the two very difficult, as best.

One proposed technique which does enable utilization of these low dielectric constant materials and photoresist includes enlarging the contact area where the contact is to be made. For example, consider a series of spaced conductive lines formed at the same substantial level relative to a semiconductor substrate, and having organic insulating dielectric layer material therebetween. Consider also a silicon dioxide layer overlying both the conductive lines and organic insulating dielectric layer material, and through which a contact opening utilizing photoresist is to be made to one of the conductive lines. If the contact opening to the line is slightly misaligned such that the organic insulator is also exposed, etching of the silicon dioxide selectively relative to both the conductive line and organic material can be conducted such that disastrous over-etch will not occur. Yet, subsequent photoresist strip will undesirably also result in etching of the organic insulating dielectric material exposed within the contact opening. Such could result in destruction of the circuit. Such can be prevented by enlarging of the contact area of the line to which the contact opening is to be etched to avoid exposure of the organic material upon mask misalignment of a certain degree. However, this is at the expense of consuming precious wafer real estate.

Accordingly, a need remains to develop improved techniques utilizing photoresist in etchings involving organic dielectric layer materials. Although the invention spawned from this concern, the artisan will appreciate applicability of the invention in other semiconductor processing areas, with the invention only being limited by the accompanying claims appropriately interpreted in accordance with the Doctrine of Equivalents.

SUMMARY

In but one aspect, the invention provides a method of exposing a material from which photoresist cannot be substantially selectively removed utilizing photoresist. In one preferred implementation, a first material from which photoresist cannot be substantially selectively removed is formed over a substrate. At least two different material layers are formed over the first material. Photoresist is deposited over the two layers and an opening formed within the photoresist over an outermost of the two layers. First etching is conducted through the outermost of the two layers within the photoresist opening to outwardly expose an innermost of the two layers and form an exposure opening thereto. After the first etching, photoresist is stripped from the substrate. After the stripping, a second etching is conducted of the innermost of the two layers within the exposure opening.

In accordance another aspect, the invention provides a method of forming a contact opening to a device formed adjacent an organic insulating dielectric material. In yet another aspect, the invention provides a method of forming a series of conductive lines within an organic insulating dielectric material.

In still another aspect of the invention, laser ablation of photoresist is utilized. In one implementation, the invention comprises forming a first material over a substrate. Photoresist is deposited over the first material and an opening is formed within the photoresist over the first material. Etching is then conducted into the first material through the photoresist opening. After the etching, the photoresist is laser ablated from over the first material.

BRIEF DESCRIPTION OF THE DRAWINGS

Preferred embodiments of the invention are described below with reference to the following accompanying drawings.

FIG. 1 is a diagrammatic sectional view of a semiconductor wafer fragment at one processing step in accordance with the invention.

FIG. 2 is a view of the FIG. 1 wafer at a processing step subsequent to that shown by FIG. 1.

FIG. 3 is a view of the FIG. 1 wafer at a processing step subsequent to that shown by FIG. 2.

FIG. 4 is a view of the FIG. 1 wafer at a processing step subsequent to that shown by FIG. 3.

FIG. 7 is a diagrammatic sectional view of another semiconductor wafer fragment at another processing step in accordance with the invention.

FIG. 8 is a view of the FIG. 7 wafer at a processing step subsequent to that shown by FIG. 7.

FIG. 15 is a view of the FIG. 13 wafer at a processing step subsequent to that shown by FIG. 14.

FIG. 16 is a view of the FIG. 13 wafer at a processing step subsequent to that shown by FIG. 15.

FIG. 17 is a diagrammatic sectional view of another semiconductor wafer fragment at another processing step in accordance with the invention.

FIG. 18 is a view of the FIG. 17 wafer at a processing step subsequent to that shown by FIG. 17.

FIG. 21 is a diagrammatic sectional view of another semiconductor wafer fragment at another processing step in accordance with the invention.

FIG. 22 is a view of the FIG. 21 wafer at a processing step subsequent to that shown by FIG. 21.

DETAILED DESCRIPTION OF THE PREFERRED EMBODIMENTS

Figure 5:
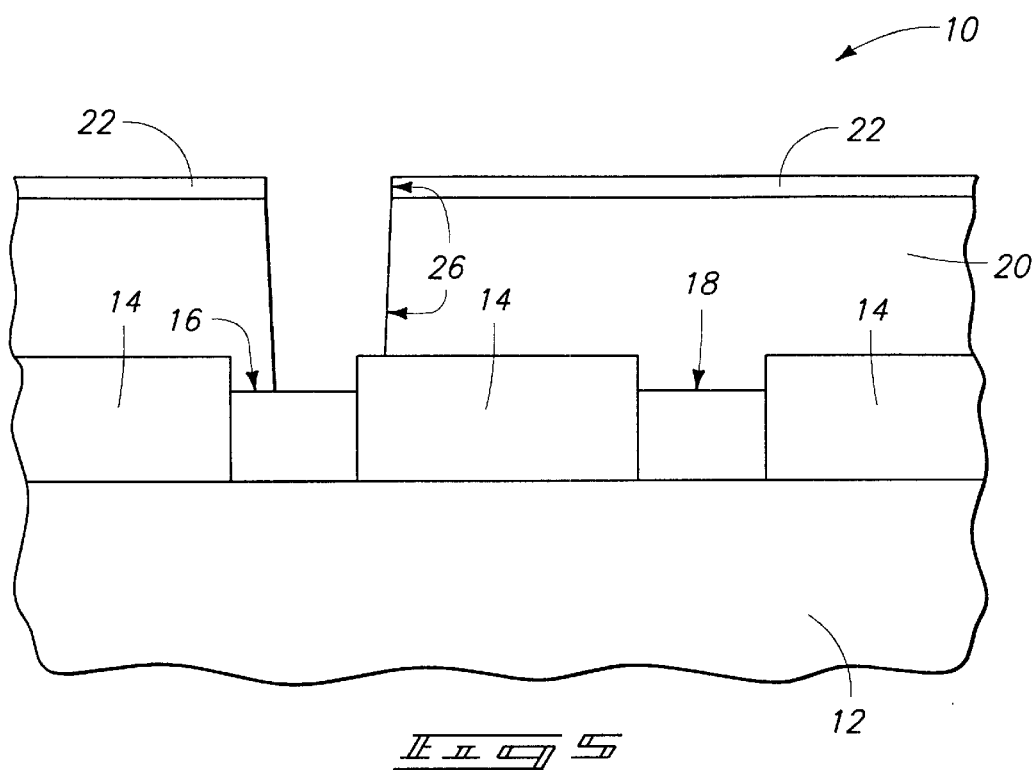
FIG. 5 is a view of the FIG. 1 wafer at a processing step subsequent to that shown by FIG. 4.

This disclosure of the invention is submitted in furtherance of the constitutional purposes of the U.S. Patent Laws "to promote the progress of science and useful arts" (Article 1, Section 8).

Referring initially to the embodiment of FIGS. 1–6, a semiconductor wafer fragment in process is indicated generally with reference numeral 10. Such comprises a substrate 12, for example in the form of a bulk monocrystalline silicon wafer. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other material's). The term "substrate" refers to any supporting structure, including, but not limited to, the semiconductive substrates described above.

An organic insulating dielectric material layer 14 is formed outwardly of substrate 12. Example and preferred materials includes parylene, parylene-N, parylene-F, polytetrafluoroethylene (PTFE), and perfluorocyclobutane (PFCB). Layer 14 constitutes a first material from which photoresist cannot be substantially selectively removed over a substrate, for example, by chemical etching. Devices 16 and 18 are formed over substrate 12 relative to first material layer 14. In the preferred embodiment, such constitute conductive lines or runners to which electrical contact is desired to be made. As preferred and shown, lines 16 and 18 are formed laterally adjacent and in contact with organic insulating dielectric material layer 14. Such layer is formed to project elevationally outwardly beyond the outermost portions of lines/devices 16 and 18. Exemplary techniques for making this or other structures are disclosed in co-pending U.S. patent application Ser. No. 08/677,514, filed on Jul. 10, 1996, entitled "Interlevel Dielectric Structure And Methods For Forming The Same", and listing as inventors, Gurtej S. Sandhu, Anand Srinivasan, and Ravi Iyer, and is hereby incorporated by reference.

Referring to FIG. 2, two layers 20 and 22 are formed over devices 16, 18 and organic insulating dielectric material layer 14. Such ideally are comprised of two different materials, and preferably two different inorganic insulating dielectric materials. Layer 20 constitutes an innermost of the two layers and is formed to a greater thickness than layer 22, which constitutes an outermost of the two layers. Exemplary thicknesses for layers 20 and 22 are 8000 Angstroms and 1000 Angstroms, respectively. Ideally, innermost layer 20 is fabricated of a material which can be substantially selectively etched relative to outermost layer 22. As well, outermost layer 22 is ideally fabricated of a material which can be substantially selectively etched relative to innermost layer 20. Further, both of layers 20 and 22 ideally comprise a material from which photoresist can be substantially selectively chemically removed. An exemplary material for layer 20 is doped or undoped $SiO_2$, with an exemplary material for layer 22 comprising $Si_3N_4$.

Referring to FIG. 3, a layer 24 of photoresist is deposited over layers 22 and 20. An opening 25 is formed within photoresist layer 24 over outermost layer 22 and over device 16. In this embodiment, an exemplary contact opening will be formed relative to device 16, with the mask utilized to form opening 25 being shown inadvertently slightly misaligned to the right.

Referring to FIG. 4, first etching is conducted through outermost layer 22 within photoresist opening 25 to outwardly expose innermost layer 20, and effectively form a contact or exposure opening 26 thereto. Preferably, the etching of layer 22 is conducted substantially selectively relative to layer 20. An exemplary chemistry for such etching for layer 22 constitutes $Si_3N_4$, and layer 20 constitutes $SiO_2$ includes HBr and $CF_4$ plasma.

Referring to FIG. 5, photoresist layer 24 has been stripped from substrate 10, ideally substantially selective relative to layers 20 and 22. After the stripping, second etching is conducted of innermost layer 20 within exposure/contact opening 26. In the illustrated embodiment, such second etching is conducted to extend contact/exposure opening 26 inwardly to effectively outwardly expose first material layer 14 and device 16. Such second etching also is preferably conducted to be substantially selective relative to outer layer 22 and substantially selective relative to first material 14. Where layer 20 comprises $SiO_2$, layer 22 comprises $Si_3N_4$, and layer 14 comprises parylene, such an exemplary etch chemistry is $O_2$ and $CF_4$ plasma. While processing of two layers 20 and 22 overlying devices 16 and 18 are shown in this embodiment, more than two layers might also be utilized.

Such provides one exemplary semiconductor processing method of exposing a material from which photoresist cannot be substantially selectively removed utilizing photoresist in the process, and of forming a contact opening to a device formed adjacent such material.

Figure 6:
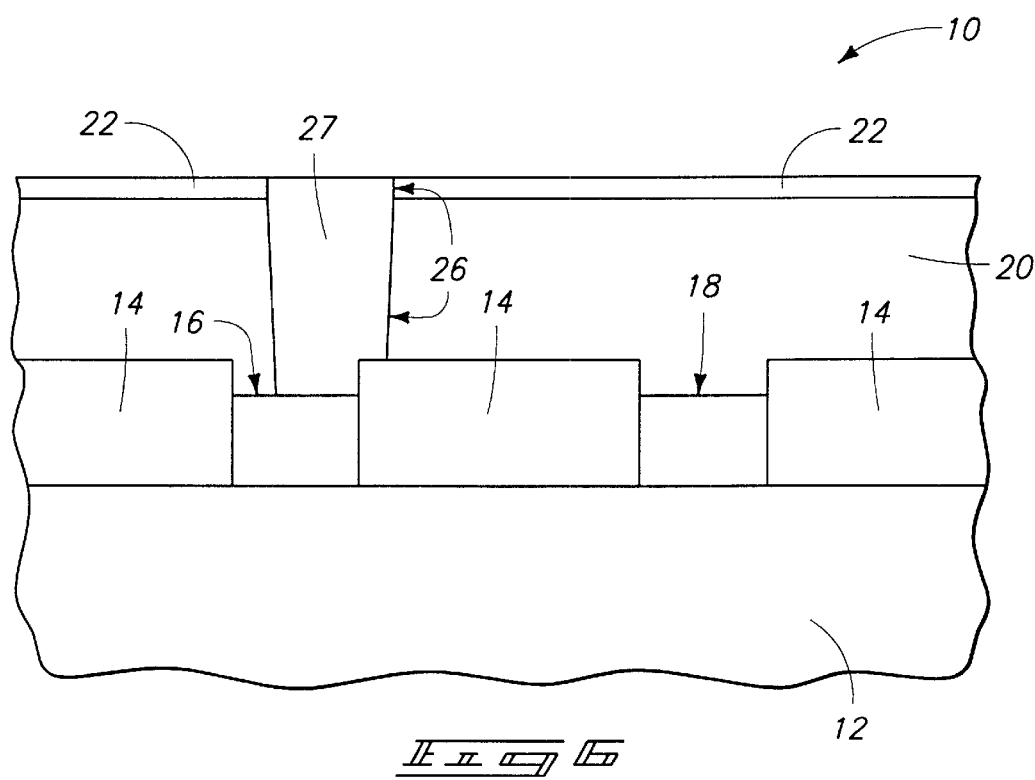
FIG. 6 is a view of the FIG. 1 wafer at a processing step subsequent to that shown by FIG. 5.

Referring to FIG. 6, contact opening 26 is effectively plugged with an electrically conductive material 27, such as tungsten, after the second etching. An exemplary technique would be to deposit tungsten and etch such back by a resist etchback process or by an abrasive polishing process. Outermost layer 22 can remain as shown, or optionally be removed either before or after the illustrated plugging.

An alternate embodiment is described with reference to FIGS. 7–9. Like numerals from the first described embodiment are utilized where appropriate, with differences being indicated with the suffix "a" or with different numerals. In FIG. 7, substrate 10a includes devices 16 and 18 and an organic insulating dielectric material layer 14a formed thereover. Thus, devices 16 and 18 also in this embodiment are formed both laterally adjacent and in contact with organic insulating dielectric material layer 14a, with such layer here projecting elevationally outwardly beyond and over devices 16 and 18. In this embodiment, outer layer 22a is provided to a greater thickness than inner layer 20a. Exemplary and preferred materials for layer 22a and 20a are either $SiO_2$ or $Si_3N_4$ as in the above embodiment.

Referring to FIG. 8, initial contact or exposure opening 26a is etched through layer 22a effectively to outwardly expose innermost layer 20a. If for example layer 20a constitutes $Si_3N_4$ and layer 22a constitutes $SiO_2$, an exemplary etch chemistry would include $CF_4$ and $CHF_3$ plasma. If the compositions of these materials were reversed, an exemplary chemistry would be that as described above with respect to the first described embodiment.

Figure 9:
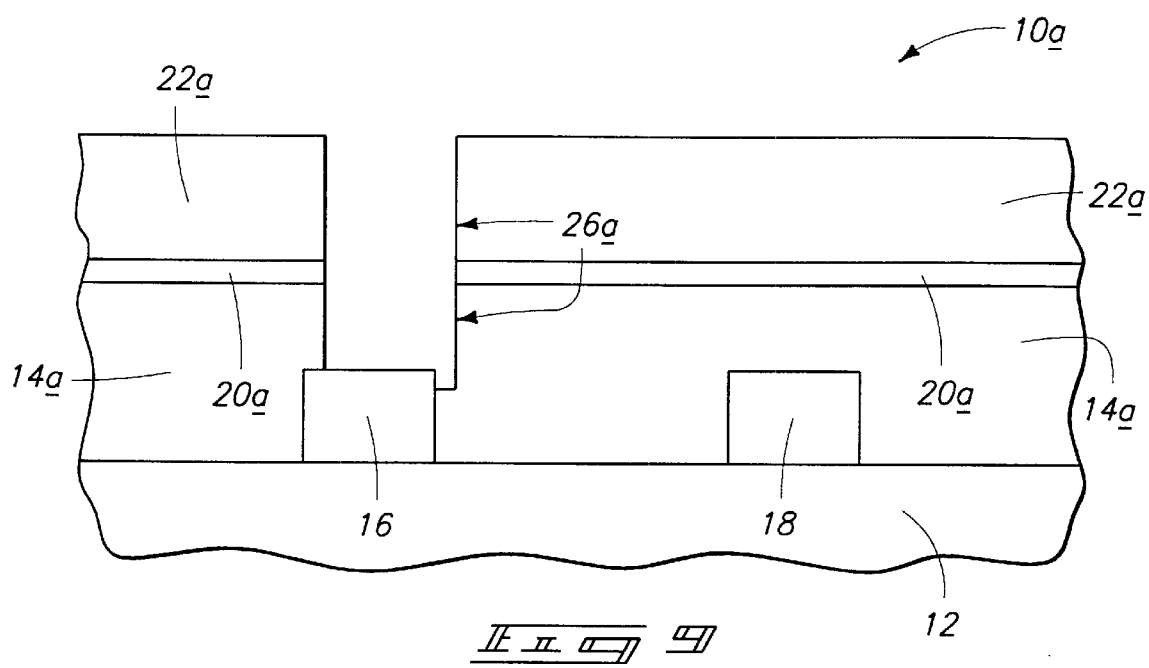
FIG. 9 is a view of the FIG. 7 wafer at a processing step subsequent to that shown by FIG. 8.

Referring to FIG. 9, photoresist layer 24 has been stripped. After such stripping, second etching is conducted of innermost layer 20a. Such etching preferably and as shown is initially conducted to at least outwardly expose first material layer 14a. Etching is then preferably continued of first material layer 14a for a period of time effective to outwardly expose device 16. Such is also preferably conducted substantially selective relative to layers 22a, 20a, and device 16. Where layers 22a, 20a, 14a and device 16 constitute $SiO_2$, $Si_3N_4$, parylene and TiN/Al, an exemplary etch chemistry includes $O_2$ and $CF_4$ plasma. Subsequent plugging of contact opening 26a can be conducted. Layers 22a and 20a can either be optionally removed before or after such plugging.

Figure 10:
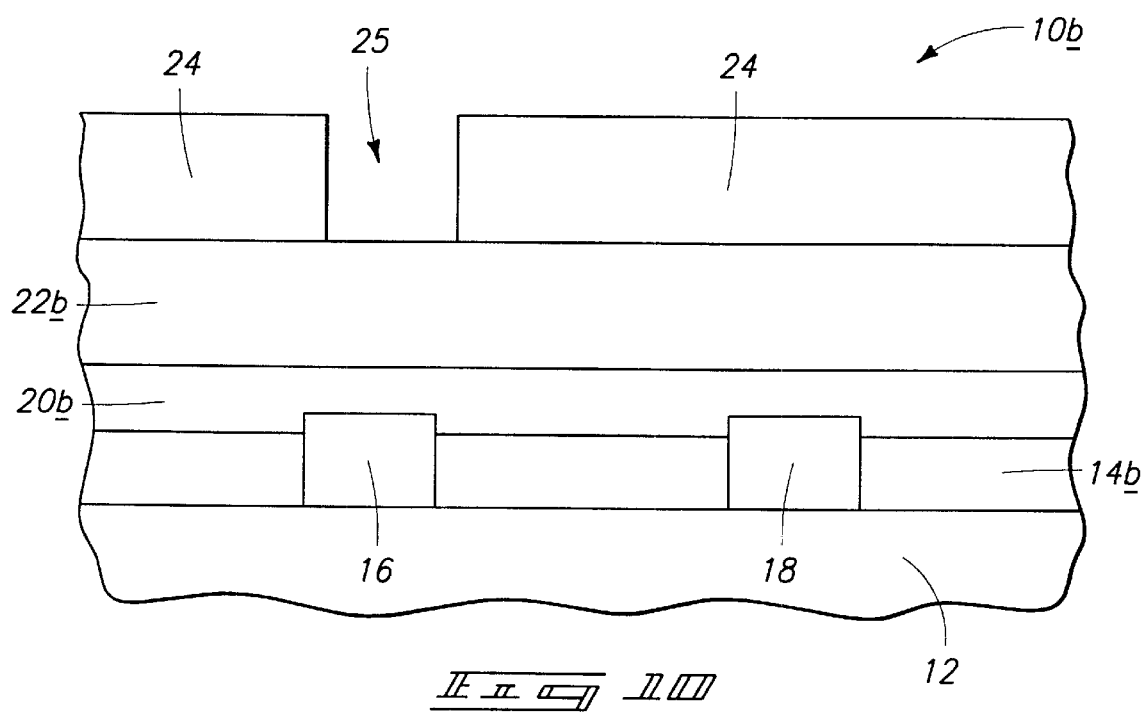
FIG. 10 is a diagrammatic sectional view of still another semiconductor wafer fragment at still another processing step in accordance with the invention.

Another alternate embodiment is described with reference to FIGS. 10–12. Like numerals from the first described embodiment are utilized where appropriate, with differences being indicated with the suffix "b" or with different numerals. In FIG. 10, a substrate 10b is fabricated such that devices 16 and 18 project elevationally outward beyond organic insulating dielectric material layer 14b. Alternately, but less preferred, devices 16 and 18 can have outer surfaces coincident with the outer surface of organic insulating dielectric material layer 14b. Layers 20b and 22b are provided outwardly of the devices and first material layer.

Figure 11:
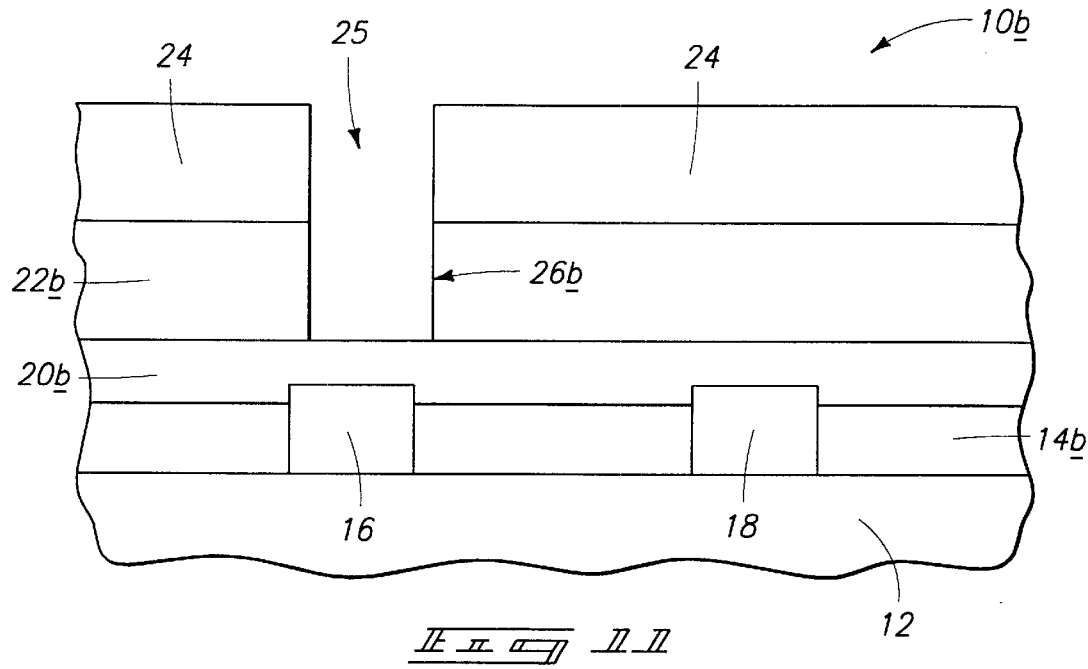
FIG. 11 is a view of the FIG. 10 wafer at a processing step subsequent to that shown by FIG. 10.
Figure 12:
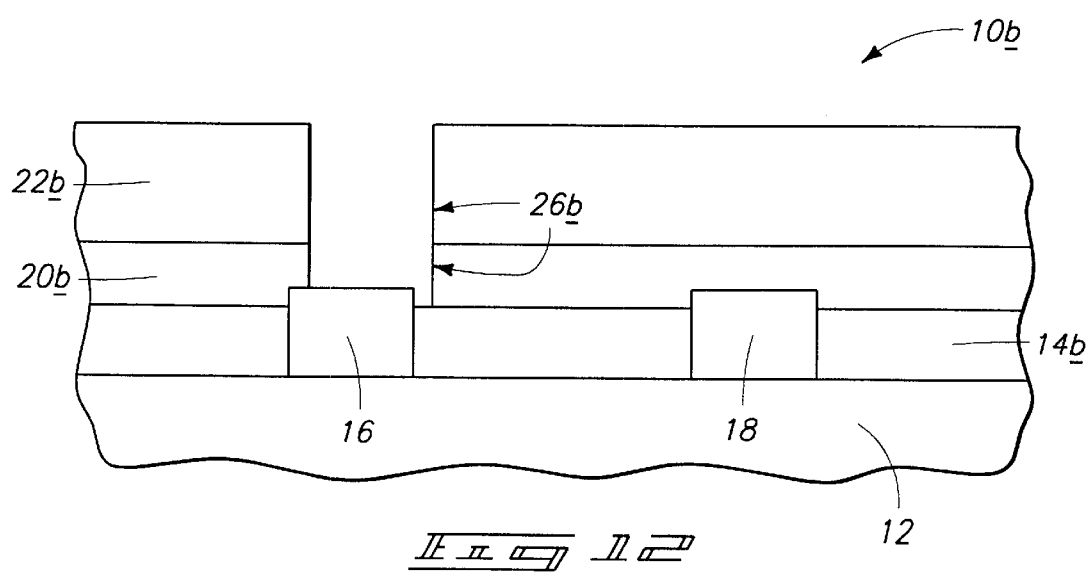
FIG. 12 is a view of the FIG. 10 wafer at a processing step subsequent to that shown by FIG. 11.

Referring to FIGS. 11 and 12, processing is conducted analogously to that described above. Specifically in FIG. 11, first etching is conducted through outermost layer 22b within photoresist opening 25 to outwardly expose innermost layer 20b and form a contact or other exposure opening 26b thereto. FIG. 12 illustrates subsequent stripping of the photoresist and second etching of innermost layer 20b ideally substantially selectively relative to outermost layer 22b and organic insulating dielectric material layer 14b to outwardly expose device 16. Subsequent plugging of such contact opening could then occur. Outermost layer 22b could optionally remain or be removed.

Figure 13:
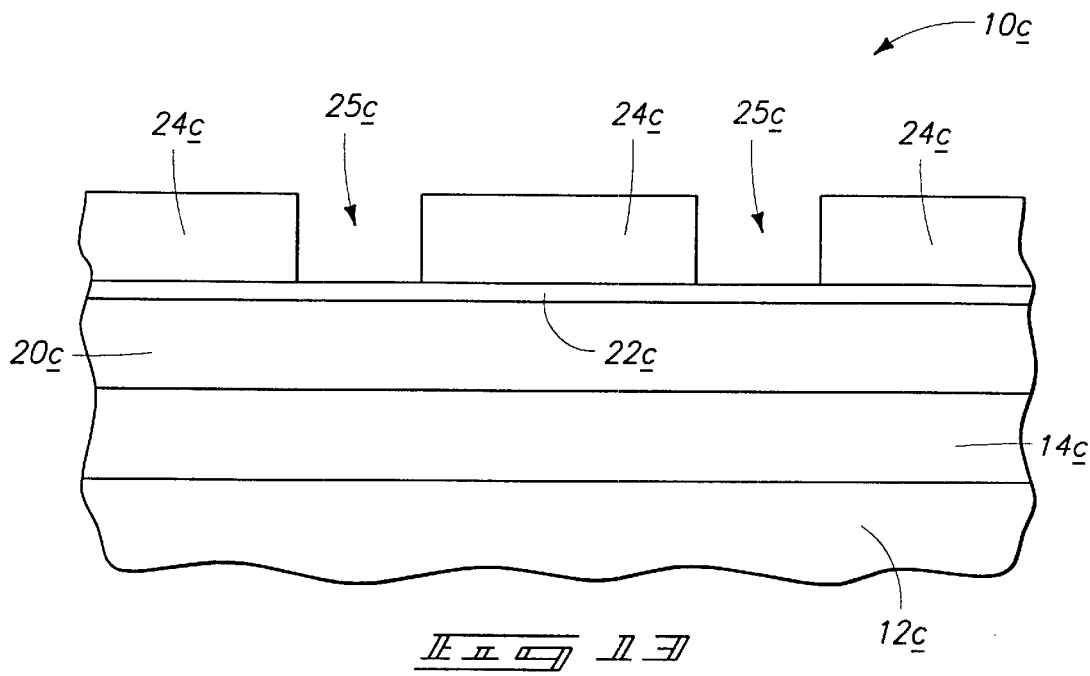
FIG. 13 is a diagrammatic sectional view of yet another semiconductor wafer fragment at yet another processing step in accordance with the invention.

Still another alternate embodiment is described with reference to FIGS. 13–16. Like numerals from the first described embodiment are utilized where appropriate, with differences being indicated with the suffix "c" or with different numerals. In FIG. 13, a substrate 10c is illustrated in a method of forming a series of conductive lines within an organic insulating dielectric material from which photoresist cannot be substantially selectively removed. In this embodiment, organic insulating dielectric material layer 14c is formed over some substrate 12c. A photoresist layer 24c is formed outwardly of layer 22c and includes a series of conductive line openings 25c formed in a desired pattern of conductive lines running into and out of the plane of the page upon which FIG. 13 lies.

Figure 14:
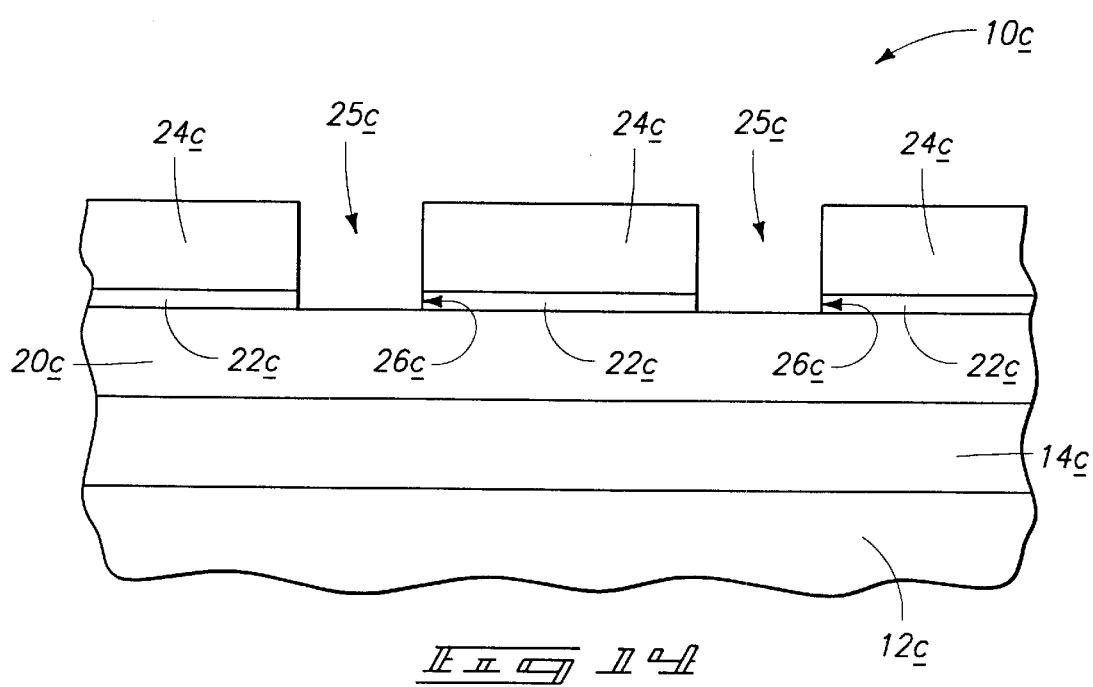
FIG. 14 is a view of the FIG. 13 wafer at a processing step subsequent to that shown by FIG. 13.

Referring to FIG. 14, first etching is conducted through outermost layer 22c within the series of photoresist openings 25c to outwardly expose innermost layer 20c and form a series of conductive line pattern openings 26c within outermost layer 22c.

Referring to FIG. 15, photoresist layer 24c has been stripped and second etching conducted of innermost layer 20c and first material layer 14c to form conductive line pattern openings 26c within first material 14c. Layers 22c and/or 20c can optionally be removed from the substrate.

Referring to FIG. 16, conductive line pattern openings 26c within material 14c are filled with conductive material and planarized back to form a series of conductive lines 35 within material 14c.

Yet another embodiment is next described with reference to FIGS. 21–24. Like numerals from the first described embodiment are utilized where appropriate, with differences being indicated with the suffix "f" or with different numerals. In FIG. 21, a substrate 10f is illustrated in a method of forming a series of conductive lines within an organic insulating dielectric material from which photoresist cannot be substantially selectively removed. In this embodiment, a first or organic insulating dielectric material layer 14f is formed over some substrate 12f. A second or dielectric material layer 20f from which photoresist can be substantially selectively chemically removed is provided over layer 14f. A photoresist layer 24f is formed outwardly of layer 20f and includes a series of conductive line openings 25f formed in a desired pattern of conductive lines running into and out of the plane of the page upon which FIG. 21 lies.

Referring to FIG. 22, first etching is conducted into the second material layer 20f through photoresist openings 25f, yet to a degree insufficient to outwardly expose first material layer 14f. Second material line pattern openings 26f in material 20f are thus formed. An exemplary etch chemistry where layer 20f constitutes $SiO_2$ includes $O_2$ and $CF_4$ plasma for a selected period of time insufficient to reach layer 14f.

Figure 23:
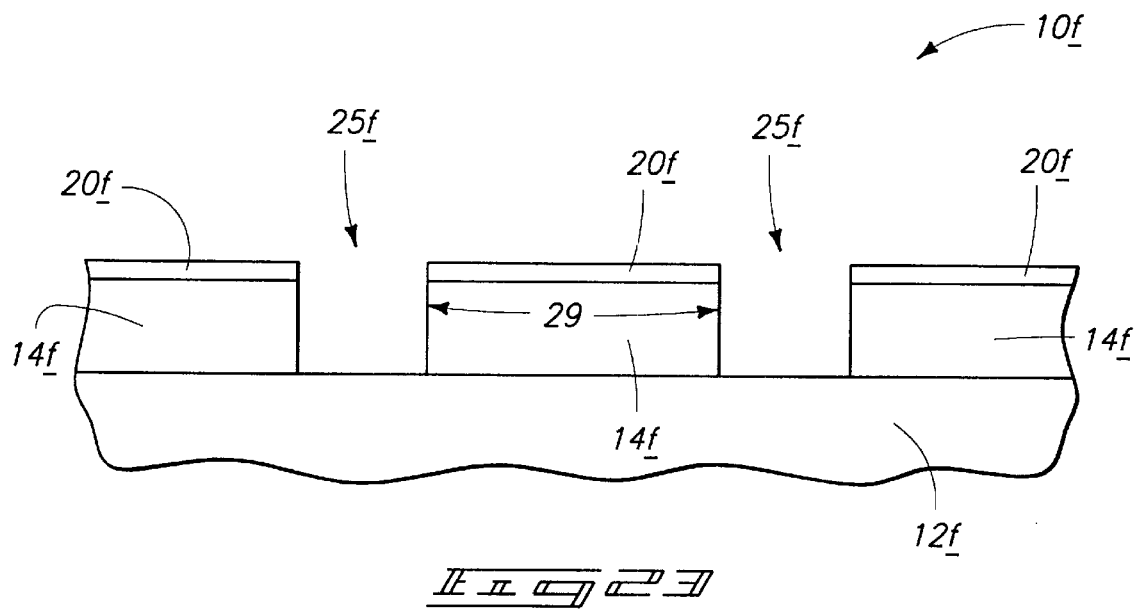
FIG. 23 is a view of the FIG. 21 wafer at a processing step subsequent to that shown by FIG. 22.

Referring to FIG. 23, photoresist layer 24f has been stripped and blanket etching conducted of second material layer 20f and first material layer 14f to form first material openings 29 to substrate 12f. An example chemistry is $O_2$ and $CF_4$ plasma. Depending on the time of such etch and the relative thicknesses of layers 14f and 20f, a portion of second material layer 20f can remain.

Figure 24:
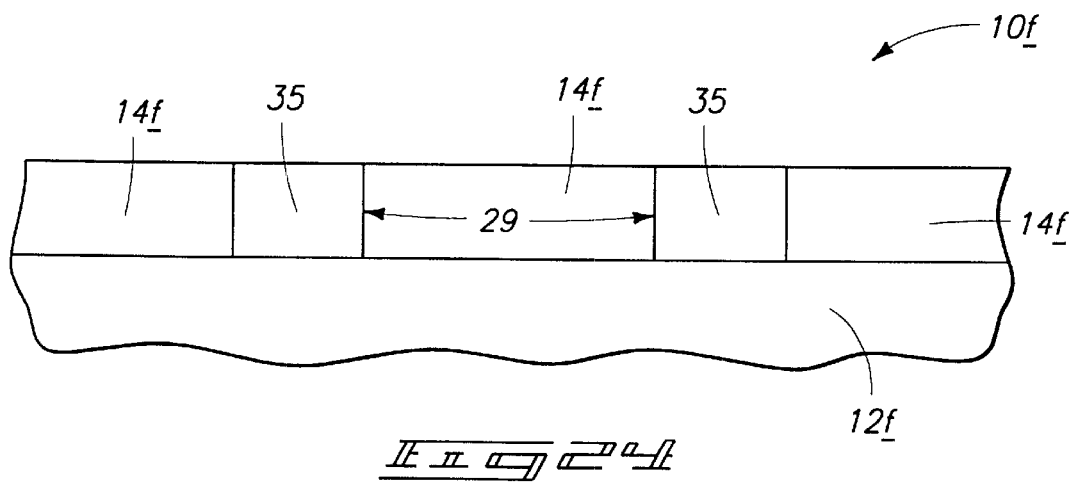
FIG. 24 is a view of the FIG. 21 wafer at a processing step subsequent to that shown by FIG. 23.

Referring to FIG. 24, the remaining portion of layer 20f is optionally removed, and openings 29 filled with and electrically conductive material 35 to form electrically conductive material within layer 14f.

Another embodiment is described in FIGS. 17 and 18. Like numerals from the first described embodiment are utilized where appropriate, with differences being indicated with the suffix "d" or with different numerals. In this embodiment substrate 10d (FIG. 17), an organic insulating dielectric material layer 14d is formed over previously patterned conductive lines 16d and 18d, preferably as in the FIGS. 7–9 embodiment. Photoresist layer 24d is provided over and on organic insulating dielectric layer 14d. Opening 25d is formed within photoresist layer 24d over organic insulating dielectric layer 14d. Timed etching is then conducted into first material layer 14d through photoresist opening 25d effective to form a contact opening 26d to device 16d (FIG. 18). Subsequently, photoresist layer 24d is laser ablated from over first material 14d. An example laser and energy for such process includes a KrF laser operating at a wavelength of 248 nanometers and energy at 2.0 $J/cm^2$. Accordingly, such laser ablating occurs when both first material layer 14d and photoresist layer 24d are outwardly exposed.

Figure 19:
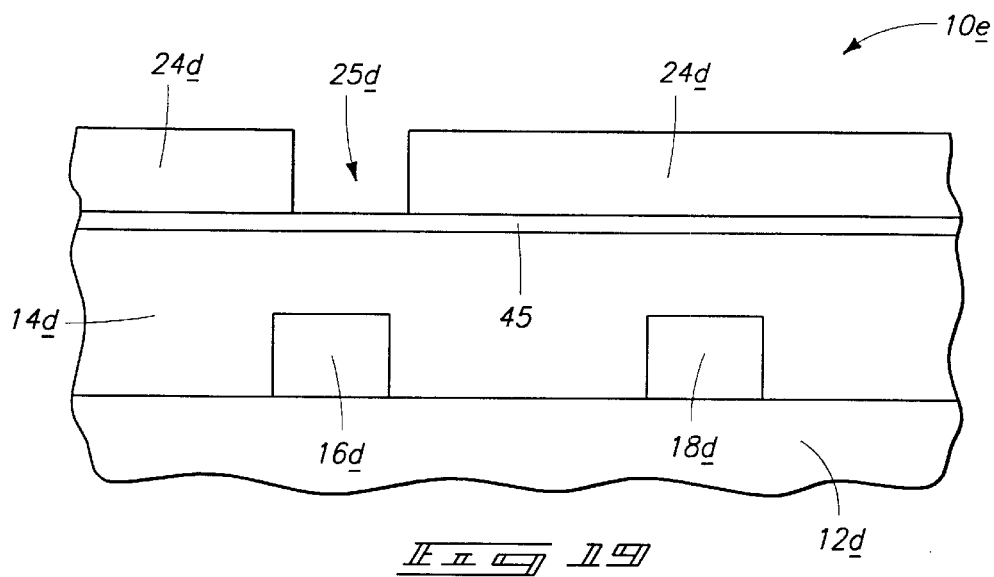
FIG. 19 is a diagrammatic sectional view of another semiconductor wafer fragment at another processing step in accordance with the invention.
Figure 20:
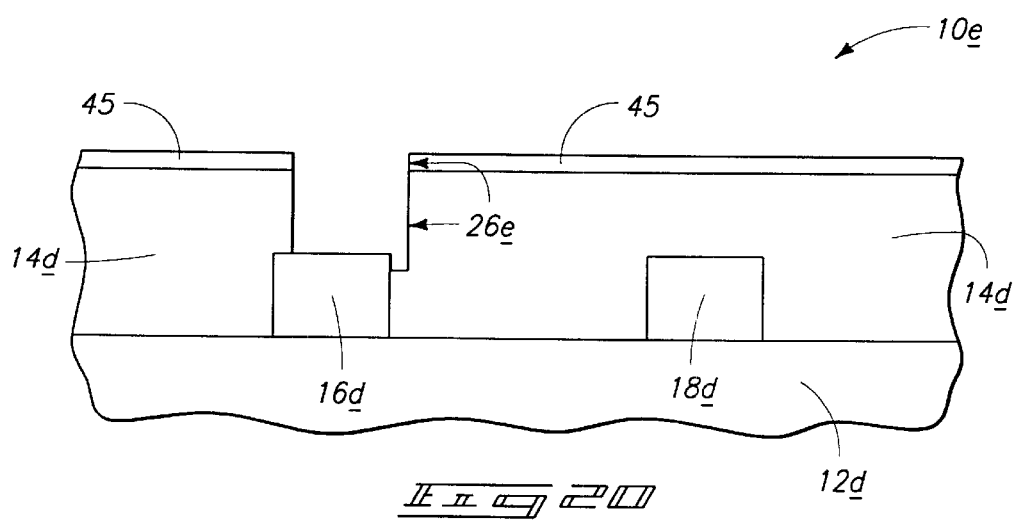
FIG. 20 is a view of the FIG. 19 wafer at a processing step subsequent to that shown by FIG. 19.

An alternate embodiment to that of FIGS. 17 and 18 is depicted in FIGS. 19 and 20. Like numerals from the FIGS. 17 and 18 embodiment are utilized where appropriate, with differences being indicated by substitution of the suffix "e" or with different numerals. Referring initially to FIG. 19, a thin light-absorbing layer 45 is formed outwardly of layer 14d prior to deposition of photoresist layer 24d, such that it is interposed therebetween. Exemplary and preferred materials include $Si_3N_4$, TiN, Al, and W. Such a layer can facilitate absorption laser energy by photoresist layer 24d, and effectively reflect such laser energy from impinging upon organic insulating dielectric layer 14d.

FIG. 20 illustrates such layer 45 remaining after laser ablation of layer 24d. Layer 45 can optionally remain or be removed prior to plugging of extended contact opening 26e. Layer 45 is preferably chosen to be very thin, and most preferably to be substantially equal to one-fourth of the wavelength of the laser light being utilized, For example, for a KrF laser having a wavelength of 248 nanometers, an exemplary preferred thickness for layer 45 is about one/fourth of this wavelength, which equals 62 Angstroms.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:
   forming an organic material over a substrate;
   forming photoresist on the organic material and forming an opening within the photoresist over the organic material;
   etching into the organic material through the photoresist opening; and
   after the etching, laser ablating at least part of the photoresist from over the organic material.

2. The method of claim 1 wherein the organic material comprises an organic insulating dielectric material.

3. The method of claim 1 wherein the photoresist comprises an organic photoresist.

4. The method of claim 1 wherein the laser ablating comprises laser ablating substantially all of the photoresist.

5. The method of claim 1 wherein the forming photoresist comprises depositing photoresist.

6. The method of claim 1 wherein the laser ablating occurs when both the organic material and the photoresist are outwardly exposed.

7. A semiconductor processing method comprising:
   forming a first material from which photoresist cannot be substantially selectively etched over a substrate;
   forming photoresist on the first material and forming an opening within the photoresist over the first material;
   etching into the first material through the photoresist opening; and
   after the etching, laser ablating at least part of the photoresist from over the first material.

8. The method of claim 7 wherein the photoresist comprises an organic photoresist.

9. The method of claim 7 wherein the laser ablating occurs when both the first material and the photoresist are outwardly exposed.

10. A semiconductor processing method comprising:
    forming an organic material over a substrate;
    forming a light absorbing layer over the organic material;
    forming photoresist over the light absorbing layer and forming an opening within the photoresist and light absorbing layer over the organic material;
    etching into the organic material through the photoresist opening and light absorbing layer opening; and
    after the etching, laser ablating at least part of the photoresist from over the organic material.

11. The method of claim 10 wherein the light absorbing layer is formed on the organic material and the photoresist is formed on the light absorbing layer.

12. The method of claim 10 wherein the light absorbing layer is formed on the organic material.

13. The method of claim 10 wherein the photoresist is formed on the light absorbing layer.

14. The method of claim 10 wherein the organic material comprises an organic insulating dielectric material.

15. The method of claim 10 wherein the photoresist comprises an organic photoresist.

16. The method of claim 10 wherein the laser ablating comprises laser ablating substantially all of the photoresist.

17. The method of claim 10 wherein the forming photoresist comprises depositing photoresist.

18. The method of claim 10 wherein the laser ablating occurs when both the organic material and the photoresist are outwardly exposed.

19. A method of forming a contact opening to a device formed adjacent an organic insulating dielectric material comprising:

forming a device adjacent an organic insulating dielectric material over a substrate;

forming photoresist on the organic insulating dielectric material and forming an opening within the photoresist over the device;

performing a timed etch of the organic insulating dielectric material below the photoresist opening for a time sufficient to form a contact opening to the device; and after the timed etch, laser ablating the photoresist from over the organic insulating dielectric material.

\* \* \* \* \*

UNITED STATES PATENT AND TRADEMARK OFFICE
CERTIFICATE OF CORRECTION

PATENT NO.    : 6,495,468 B2
DATED         : December 17, 2002
INVENTOR(S)   : Gurtej S. Sandhu et al.

It is certified that error appears in the above-identified patent and that said Letters Patent is hereby corrected as shown below:

Column 4,
Line 11, replace "material's" with -- materials --.

Column 10,
Line 3, replace "forming photoresist" with -- forming a photoresist --.

Signed and Sealed this

Sixth Day of May, 2003

JAMES E. ROGAN
*Director of the United States Patent and Trademark Office*